United States Patent [19]
Braat

[11] Patent Number: 5,467,335
[45] Date of Patent: Nov. 14, 1995

[54] BEAM-SHAPING OPTICAL ELEMENT AND DEVICE FOR CONVERTING A BEAM HAVING A FIRST CROSS-SECTION INTO A BEAM HAVING A SECOND CROSS-SECTION

[75] Inventor: Josephus J. M. Braat, Eindhoven, Netherlands

[73] Assignee: U. S. Philips Corporation, New York, N.Y.

[21] Appl. No.: 175,075

[22] Filed: Dec. 29, 1993

[30] Foreign Application Priority Data

Jan. 4, 1993 [EP] European Pat. Off. ............... 9320005

[51] Int. Cl.⁶ .......................... G11B 7/00; G02B 27/09
[52] U.S. Cl. .................... 369/100; 369/112; 369/116; 359/710; 359/711; 359/894; 359/641
[58] Field of Search ................. 369/100, 112, 369/116; 359/0.669, 671, 206, 212, 652, 668, 209, 207, 0.641, 503, 0.894, 0.710, 0.711

[56] References Cited

U.S. PATENT DOCUMENTS

| 4,684,222 | 8/1987 | Borrelli et al. | 359/671 |
|---|---|---|---|
| 4,805,997 | 2/1989 | Asahara et al. | 359/652 |
| 4,915,484 | 4/1990 | Yamamoto | 359/668 |
| 5,005,928 | 4/1991 | Suzuki et al. | 359/206 |
| 5,068,751 | 11/1991 | Braat et al. | 359/209 |
| 5,255,113 | 10/1993 | Yoshikawa | 359/207 |

FOREIGN PATENT DOCUMENTS

| 0286368 | 10/1988 | European Pat. Off. . |
|---|---|---|
| 62-244002 | 10/1987 | Japan . |
| 62-264453 | 11/1987 | Japan . |
| 1-109316 | 4/1989 | Japan . |
| 1-244421 | 9/1989 | Japan . |
| 1-279216 | 11/1989 | Japan . |

OTHER PUBLICATIONS

"Fiber Microlenses Advance" R&D Magazine, Mar. 1992 p. 5.
"The Compact Disc Digital Audio System" M. G. Carasso et al, Philips Tech. Rev. 40, pp. 151–155, 1982, No. 6.

*Primary Examiner*—Georgia Y. Epps
*Assistant Examiner*—Kim-Kwok Chu
*Attorney, Agent, or Firm*—Michael J. Balconi-Lamica

[57] ABSTRACT

A beam-shaping element for converting a beam having an elliptical cross-section into a beam having a circular cross-section. This element has a cylindrical entrance surface and a toriodal exit surface and can be arranged close to a diode laser so that the risk of wavefront deviations due to defocusing is reduced. The element has a high coupling efficiency.

18 Claims, 5 Drawing Sheets

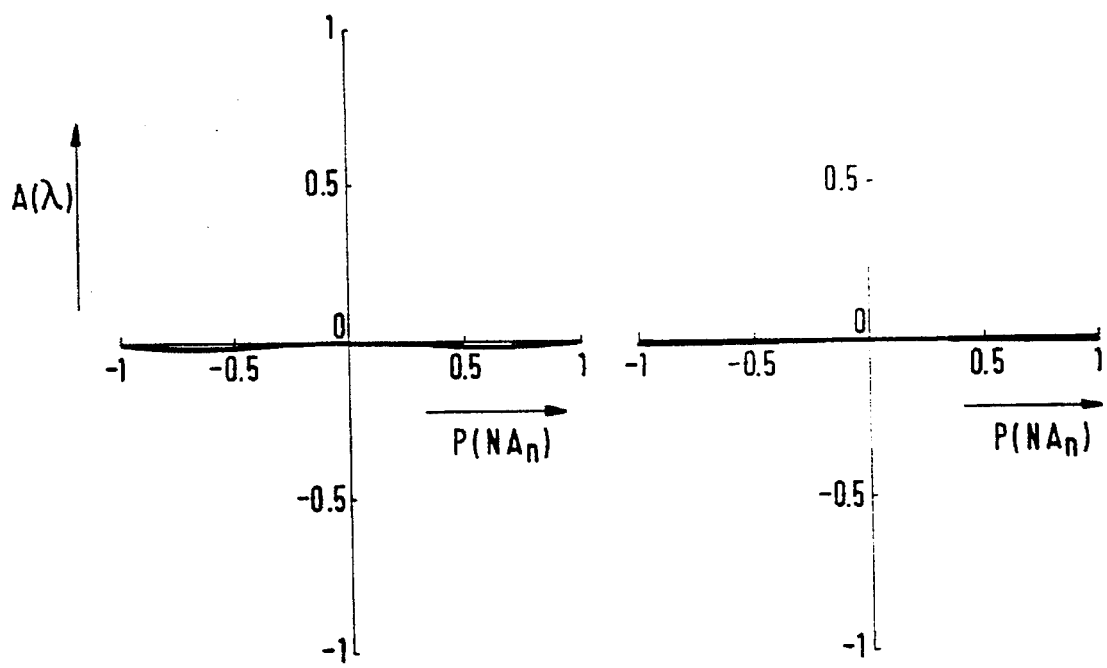
FIG. 5a    FIG. 5b
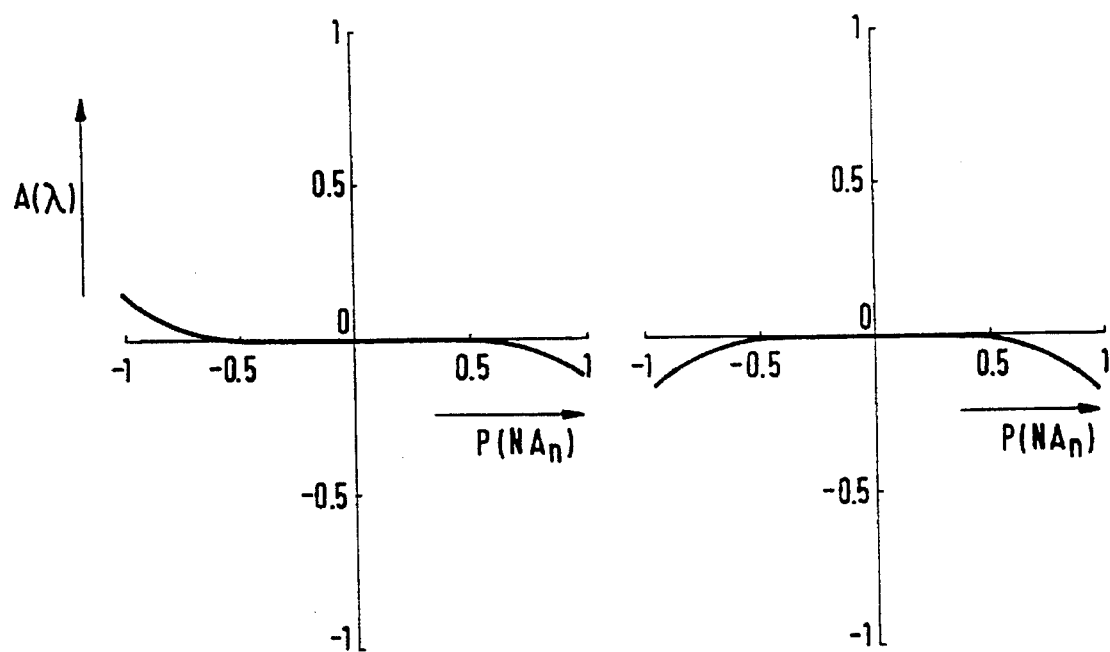
FIG. 6a
PRIOR ART
FIG. 6b
PRIOR ART

BEAM-SHAPING OPTICAL ELEMENT AND DEVICE FOR CONVERTING A BEAM HAVING A FIRST CROSS-SECTION INTO A BEAM HAVING A SECOND CROSS-SECTION

BACKGROUND OF THE INVENTION

The invention relates to a beam-shaping optical element having an entrance surface, an exit surface located opposite thereto and an optical axis which coincides with the Z axis of a three-axis rectangular XYZ system of coordinates for converting a beam having a first ratio between a first angular aperture in the YZ plane of the system of coordinates and a second, smaller angular aperture in the XZ plane into a beam having a second, smaller ratio between said angular apertures, said element realising different angular magnifications in said two planes.

The invention also relates to a radiation source unit and to an optical scanning unit, both including such a beam-shaping element.

A beam-shaping element of this type is known, for example in the form of a prism, a cylindrical lens or, as described in European Patent Application no. 0 286 368, a single lens element whose entrance and exit surfaces have a toroidal shape. This beam-shaping element is generally used in combination with a diode laser which emits a beam whose angular aperture in a plane parallel to its active layer, known as the lateral plane, is smaller than the angular aperture in the plane perpendicular to the active layer, known as the transversal plane. In the field known as the far field, the beam of such a diode laser has an elliptical cross-section. In a device in which such a diode laser is used as a radiation source, for example, a reading and/or writing device for optical record carriers in which an audio or video program or data are or can be stored, or a printer, a round and small, preferably diffraction-limited radiation spot must be formed on the medium to be scanned. To this end an imaging system, or objective system, by means of which the radiation spot is formed must be filled with a radiation beam having a circular cross-section. It is known that, starting from a diode laser, such a beam can be obtained by arranging a beam-shaping element between this laser and the objective system and at some distance from the diode laser.

In known systems using a beam-shaping element, stringent requirements must be imposed on the beam-shaping element as well as on the positioning of this element with respect to the radiation source. The known beam-shaping elements are designed in such a way that the beam shaping, hence the magnification or reduction of the beam cross-section, is realised in only one of the planes, the transversal or the lateral plane. Since the shaping in this plane must be relatively strong, stringent requirements are imposed on the parameters playing a role in beam shaping.

Moreover, in known systems using beam shaping, the beam-shaping element is arranged at a relatively large distance from the radiation source, viz. where the diverging beam emitted by the source has the required cross-section. However, stringent requirements are also imposed on the axial or Z position of the exit plane of the diode laser with respect to the beam-shaping element. If the Z position of the diode laser exit plane differs from the desired position, the laser beam will have a wavefront with a quadratic defocusing term at the area of the entrance surface of the beam-shaping element. The quadratic distortion which is a function of the angle at which a given portion of the wavefront is viewed from the centre of the radiation source is transformed in different manners by the beam-shaping element in the two main cross-sectional planes, the XZ plane and the YZ plane. In fact, the known beam-shaping elements have a relatively large angular magnification factor or scaling factor in one of these planes and a magnification equal to one in the other plane. If the beam-shaping ratio is larger than, for example two, the defocusing of the radiation source is substantially completely transformed by the beam-shaping element into a defocusing of the beam in only one of the main cross-sectional planes. This means that the beam emerging from the beam-shaping element has become astigmatic. Whereas in the optical systems under consideration a defocusing of the radiation source itself can be corrected by an active focus control for the objective system, an astigmatic wavefront error can no longer be eliminated. Consequently, stringent tolerance requirements are imposed on astigmatism. If an average wavefront deviation, i.e. the square root of the integral, across the surface of the wavefront, of the square value of the wavefront deviation divided by the surface, indicated by $OPD_{rms}$, of 0.02×the wavelength ($\lambda$) is still allowed, the astigmatic wavefront error $W_A$ should be smaller than 0.1 $\lambda$. This means that the defocusing $\Delta Z$ of the radiation source with respect to the beam-shaping element defined by $$\Delta Z = \frac{2 \cdot W_A}{(NA)^2}$$

may at most be of the order of 1.5 µm if the numerical aperture NA of the beam-shaping element is 0.35 and $\lambda$=0.8 µm.

In the commonly used optical systems, in which the beam-shaping element is arranged at a relatively large distance from the diode laser, such a strict tolerance requirement is difficult to satisfy. Due to temperature variations and mechanical shocks, axial displacements amounting to many microns may occur between the diode laser and the beam-shaping element.

SUMMARY OF THE INVENTION

The present invention has for its object to provide a beam-shaping element and a radiation source unit including such an element with which and in which, respectively, said practical drawbacks are obviated to a considerable, or substantially complete extent.

A first aspect of the invention relates to a novel concept of a beam-shaping element. This element is characterized in that the entrance surface is centrally provided with a substantially cylindrical portion whose cylindrical axis is parallel to the Y axis and introduces an angular reduction of the order of $n_1/n_2$ in the YZ plane and an angular magnification of the order of $n_2/n_1$ in the XZ plane, in which $n_2$ and $n_1$ are the refractive indices of the element material and the surrounding medium, respectively, and in that the exit surface is a toroidal surface whose radius of curvature in the XZ plane is larger than that in the YZ plane.

The beam-shaping power is now constituted by two components, viz. an angular magnification $n_2/n_1$ in the lateral plane and an angular reduction $n_1/n_2$ in the transversal plane and each of these components can be realised with less stringent tolerance requirements than those which apply to a beam-shaping element in which the beam shaping is realised in only one of these planes.

As will be further described, a combination of three elementary imaging steps is used in the beam-shaping element according to the invention, which steps are known to be free from aberration and have a high tolerance with respect to the centration and tilt of the refractive surfaces.

As already noted, European Patent Application no. 0 286 368 discloses a beam-shaping element having a toroidal exit surface. The entrance surface of this element is, however, not cylindrical but toroidal. This surface is intended for correcting aberrations in the transversal plane only, whereas the toroidal exit surface is intended for correcting aberrations in the lateral plane only. In the beam-shaping element according to the present invention the toroidal exit surface has for its purpose to image two intermediate images in one image, which intermediate images are formed in the XZ plane and the YZ plane, respectively, and are shifted in the Z direction, and the actual beam shaping is realised by the entrance surface.

There is little refraction at the exit surface of the beam-shaping element according to the invention, i.e. this surface has an angular magnification of approximately one. Consequently, the Z position of the radiation source observed via the beam-shaping element is stable at variations of all ambient parameters. This is particularly important for optical scanning devices which must have a stable position of the source with respect to detectors.

It may be desirable to reduce the aperture of the beam emerging from the beam-shaping element, which aperture is, for example, equal in the two main cross-sectional planes. To this end a collimator lens may be arranged behind the beam-shaping element in the optical system. However, when using an embodiment of the beam-shaping element which is further characterized in that a spherical surface is superimposed on the toroidal exit surface, the collimator lens may be dispensed with because the exit surface then reduces the aperture of the beam and thus functions as a collimator.

The beam-shaping element may be, for example, a moulded, glass body or, for example, a likewise moulded element of transparent synthetic material. However, the element preferably comprises a glass substrate provided with a layer of transparent synthetic material on the front side and/or the rear side in which the desired shapes are provided by means of a known replica technique. The beam-shaping elements can be manufactured in large numbers and at low cost by means of such a replica technique, starting from two moulds whose inner side is the negative of the desired shape. This is particularly important for use in consumer apparatuses.

In accordance with a further characteristic feature of the beam-shaping element, the synthetic material is polymethyl methacrylate. This material, which has a refraction coefficient n=1.483 for which the beam-shaping ratio $n^2$ may be 2.2, has the advantage that it has a small birefringence, and that satisfactory experience has been gained in the manufacture of optical components.

The beam-shaping element according to the invention may not only be used for converting a beam having an elliptical cross-section whose elliptical axes have a longitudinal ratio of, for example, 1:3, into a beam having a circular cross-section, but also for converting a beam having a highly elliptical cross-section, for example, with a longitudinal ratio of the elliptical axes of 1:5, into a beam having a less highly elliptical cross-section, for example, with a longitudinal ratio of 1:2.

A second aspect of the invention relates to the influence of a variation of the mutual positions of the radiation source and the element on the wavefront of the beam emerging from the beam-shaping element. According to the invention this influence can be considerably reduced in a radiation source unit, if this unit is characterized in that the distance between the radiation-emitting surface of the diode laser and the entrance plane of the beam-shaping element is at most several hundred μm.

At such a small distance, the diode laser and the beam-shaping element may be considerably better stabilized with respect to each other than at a distance of the order of several ram, as is customary in conventional systems.

The desired mutual stabilization of the diode laser and the beam-shaping element can be realised by fixing the diode laser and the element in a common holder.

A preferred embodiment of the radiation source unit according to the invention is, however, characterized in that the beam-shaping element and the diode laser are secured on a common support. Then, an optimum stabilization can be achieved.

The principle of reducing the distance between the diode laser and the beam-shaping element may be used in a radiation source unit having a conventional beam-shaping element, such as a cylindrical lens or a prism. This radiation source unit supplies a beam having a circularly symmetrical cross-section whose wavefront is independent of Z position changes of the diode laser due to ambient parameter variations.

However, this principle is utilized to an optimum extent in a radiation source unit which is characterized in that the beam-shaping element is an element in accordance with the present invention as described hereinbefore.

Since the beam shaping in this element is realised by the entrance plane only, mainly the position of this plane with respect to the exit plane of the diode laser is important. The position of the exit plane of the element is then less important so that it is not necessary to impose strict requirements on, for example the thickness, measured along the optical axis, of the beam-shaping element.

In the radiation source unit the radiation source in the form of a diode laser may exhibit astigmatism, i.e. the origin of the beam in the lateral plane is at a different axial position than in the transversal plane. This source astigmatism can be compensated for by adapting the shape of the toroidal surface.

In certain optical systems, for example for certain printers it may be further desirable that the ultimately formed radiation spot is elongated. The toroidal surface may be adapted in such a way that the beam emerging from this surface is suitable for forming such a radiation spot. The cylindrical entrance surface may also be adapted to specific requirements and need not be exactly cylindrical.

The invention further relates to an optical scanning device for scanning an information plane, which device comprises a diode laser radiation source unit, an objective system for focusing the radiation beam supplied by this unit to form a scanning spot on the information plane, and a radiation-sensitive detection system for convening radiation from the information plane into electric signals. This scanning device is characterized by a radiation source unit as described hereinbefore.

BRIEF DESCRIPTION OF THE DRAWING

These and other aspects of the invention will be apparent from and elucidated with reference to the embodiments described hereinafter.

In the drawings:

FIGS. 5a and 5b show aberration curves of this beam-shaping element;

FIGS. 6a and 6b show aberration curves of a known beam-shaping element;

DETAILED DESCRIPTION OF THE PREFERRED EMBODIMENT

Figure 1:
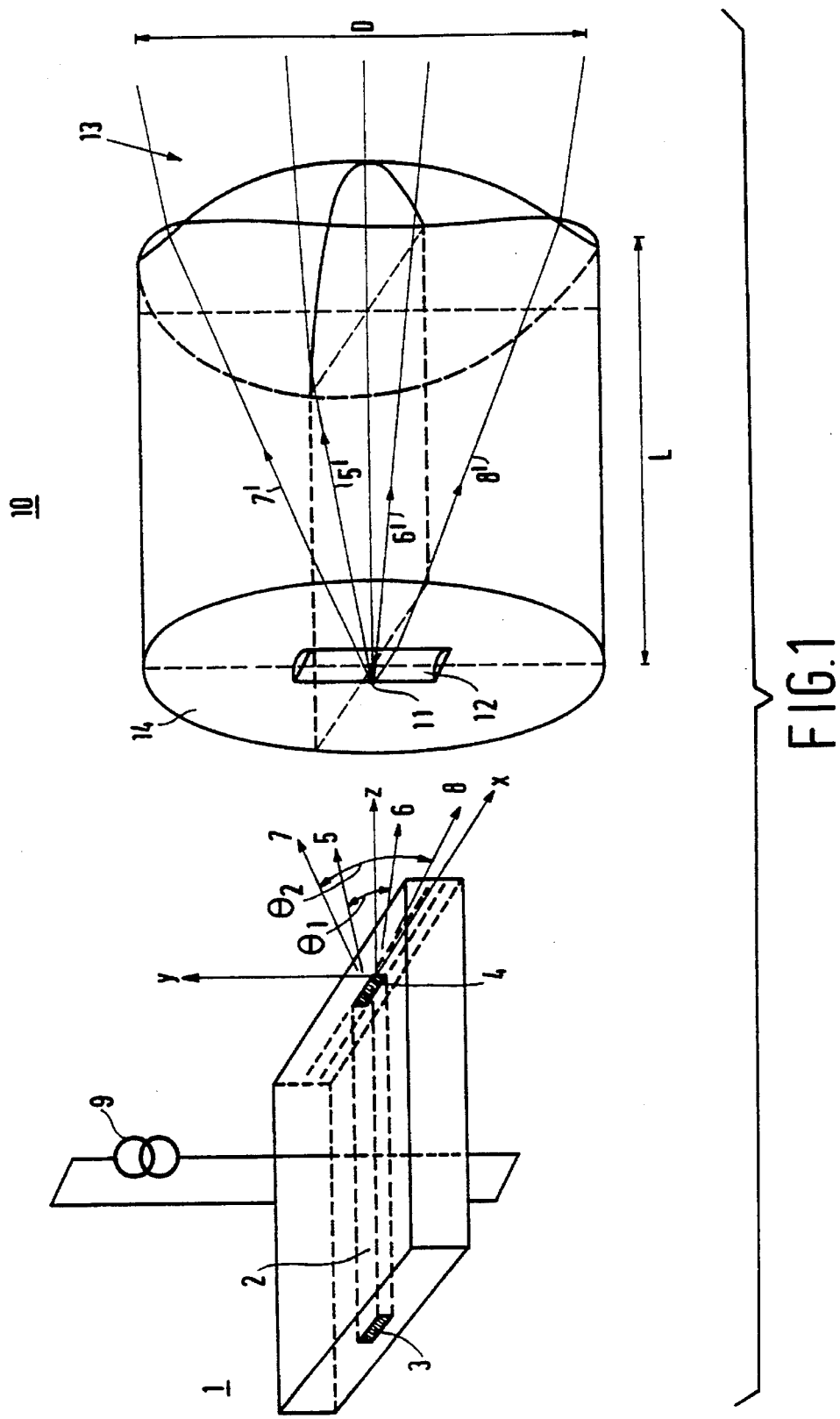
FIG. 1 is a present invention showing a radiation source unit including the beam-shaping element.

FIG. 1 shows diagrammatically a diode laser 1 and a beam-shaping element 10, and a three-axis system of coordinates XYZ. For the sake of clarity the axial distance (in the Z direction) between the diode laser and the element 10 is exaggerated. Actually, these components are close together and the area 11 at the beam-shaping element is the exit facet 4 of the diode laser.

This laser is, for example an AlGaAs laser and comprises a plurality of differently doped layers of which, for the sake of clarity, only the strip-shaped active layer 2 in which the laser radiation is generated is shown. The active strip 2 is bounded by two partially transparent mirror facets 3 and 4 so that the laser radiation, which is generated when an electric current from a current source 9 is passed through the laser, can leave the active strip 2. The radiation emerging from the front facet 4 is used to form a radiation beam, for example for an optical scanning device or for an optical printer, while the radiation emerging through the rear facet 3 may be used to monitor the behaviour of the laser.

Due to the rectangular shape of the cross-section, in the XY plane, of the active strip 2 and of the front facet 4, the beam emitted by the diode laser is not symmetrical but has an angular aperture $\Theta_1$ in the XZ plane parallel to the active strip 2, i.e. the lateral plane, which aperture is smaller than the aperture angle $\Theta_2$ in the YZ plane, i.e. the transversal plane. The border rays of the beam in the lateral plane are denoted by the reference numerals 5 and 6 and those in the transversal plane are denoted by the reference numerals 7 and 8. The beam represented by the border rays has an elliptical cross-section in the far field of the diode laser, i.e. at some distance from this laser. To make this beam suitable for use in, for example an optical scanning device or an optical printer, it has to be converted into a beam of a circular cross-section. This is realised by means of the beam-shaping element 10 according to the invention. This element has an entrance surface 12 having the shape of a part of a cylinder whose cylindrical axis is parallel to the Y axis. For the rays in the transversal plane, or YZ plane, the entrance surface is a flat interface between, for example air having a refractive index of 1 and a medium having a higher refractive index n, so that these rays are deflected towards the Z axis to an extent which is determined by n. In other words, an angular reduction of 1/n occurs for these rays and the surface 12 forms in the YZ plane a first image of the centre of the radiation source. This is the first of the elementary imaging steps mentioned hereinbefore.

The second step relates to the effect of the entrance surface in the lateral, or XZ, plane. In this plane this surface has a curvature R for which the radius of curvature is chosen to be such that the centre of the radiation source and the image point conjugated thereto by the entrance surface coincides with the aplanatic points of this, imaging, surface. The positions of the aplanatic points are given by:

$$S_0 = \left( \frac{1+n}{n} \right) R$$

$$S_1 = \left( \frac{1+n}{1} \right) R$$

in which $S_0$ and $S_1$ are positions on the Z axis of the object point and the image point. The angular magnification in the lateral plane introduced by the entrance surface 12 is equal to n.

The third elementary imaging step relates to the transversal plane as well as to the lateral plane and is realised by means of the exit surface 13 of the element 10. This surface has such a radius of curvature $R_1$ in the transversal plane and is arranged at such a Z position that its centre of curvature substantially coincides with the image, formed by the surface 12, of the centre of the laser facet 4. The surface 13 transmits the rays in the transversal plane in an unrefracted form and the angular magnification in this plane is thus equal to one. In the lateral plane the exit surface has such a radius of curvature that its centre of curvature coincides with the virtual image, formed by the surface 12, of the centre of the laser facet 4 so that the angular magnification is also approximately one in this case.

The difference between the angular magnifications realised by the beam-shaping element 10 in the transversal plane on the one hand and the lateral plane on the other hand is thus approximately $n^2$. This difference, i.e. the beam-shaping power of the element, is thus substantially entirely realised by the entrance surface which changes the vergence of the beam, both in the transversal plane and in the lateral plane. If the beam-shaping element is arranged in a medium having a refractive index $n_1$ and if the refractive index of the material of this element is $n_2$, the angular reduction in the transversal plane is $n_1/n_2$ and the angular magnification in the lateral plane is $n_2/n_1$ and the beam-shaping power is approximately $(n_1/n_2)^2$. For the positions of the aplanatic points of the entrance surface it then holds that:

$$S_0 = \frac{n_1 + n_2}{n_2} R$$

$$S_1 = \frac{n_1 + n_2}{n_1} R$$

Since the two virtual images formed by the entrance surface are located at different positions along the Z axis, the exit surface should have a slightly toroidal shape so as to combine these images to one image. Toroidal is understood to mean that the radius of curvature of the surface in the lateral plane differs from that in the transversal plane. This is shown in FIG. 1 by means of the non-coplanar peripheral curve of the exit surface.

The toroidal shape of the surface 13 may be expressed in the maximum distance, measured in the Z direction, between two points situated on the same circle on the surface. This top-to-top distance is, for example, of the order of several microns to tens of microns for the edge of the optically used surface.

It may be desirable to reduce the angular aperture of the beam emerging from the beam-shaping element 10 so that the optical elements may have smaller diameters further down the system in which the beam is used. To this end a collimator lens may be arranged behind the element 10. However, the present invention provides a further possibility, viz. of incorporating a collimation function in the beam-shaping element. To this end a spherical surface having the desired power for the desired reduction of the angular aperture is superimposed on the toroidal exit surface. The spherical surface has the same radius of curvature in the lateral and transversal planes.

In conventional scanning devices for optical record carriers the entrance numerical aperture of the beam-shaping element is approximately 0.13 in the lateral plane and approximately 0.40 in the transversal plane. Without spherical power of the exit surface in the beam-shaping element according to the invention an exit numerical aperture of 0.20 can be realised in both planes. By giving the exit surface 13 a spherical power, the exit numerical aperture can be reduced. If this aperture can be made equal to the smallest entrance numerical aperture, it can be ensured that the image realised by the exit surface satisfies the aplanatic condition in an analogous manner as described with reference to the image realised by the entrance surface 12 in the lateral plane. If the aplanatic condition is satisfied, the tolerance requirements are alleviated so that these requirements can be easily satisfied.

A diode laser beam for which the FWHM angular apertures in the lateral plane and the transversal plane are 10° and 30°, respectively, will have a symmetrical amplitude distribution at the above-mentioned NA values of 0.13 and 0.40 for the beam-shaping element after passing through this element.

If the beam has a Gaussian intensity distribution, the intensity at the edge of the beam emerging from the element may be equal to 40% of the intensity in the centre of the beam. This peripheral intensity is then equal to the intensity loss due to the limited aperture of the element. Then 60% of the radiation emitted by the diode laser is concentrated in such a way that it is available for the optical device accommodating the diode laser. The FWHM angular apertures are the mutual angles between those rays, which are directed towards the points of the wavefront where the intensity is half the intensity in the centre.

As is shown in FIG. 1, the beam-shaping element may have the shape of a cylinder having a circular cross-section with a length L of the same order as the circular diameter D. D and L are, for example 1.2 mm, a value which is defined by ease of handling. For the entrance surface 12 the radius of curvature is of the order of 15–30 μm. The wavefront deviation $OPD_{rms}$ has the desired value of 7 mλ which is considerably smaller than the Maréchal criterion of 70 mλ. The value of 7 mλ is determined by the astigmatic residual error. If desired, this residual error can be corrected by making the toroidal surface in the XZ plane and possibly in the YZ plane slightly aspherical by adding a small fourth-order correction term.

The beam-shaping element may be made of glass and the entrance surface 12 and the exit surface 11 may be obtained by grinding or moulding. The element may also be made of a transparent synthetic material, for example also by means of moulding. To obtain a beam-shaping element which can be manufactured in large numbers and at low cost and which is adequately resistant to temperature variations and humidity, a process known as replica process may be used. In such process one starts from a glass preform and the front and rear sides of this preform are provided with a layer of synthetic material in a sufficiently viscous state, such as a polymer which can be cured under the influence of ultraviolet radiation. These layers may be given the desired shapes of the entrance surface and the exit surface, respectively, by pressing moulds into them whose surfaces are the negatives of the surface 14 and the surface 13, respectively. Subsequently, the assembly is illuminated by ultraviolet radiation so that the layers are cured. After removal of the moulds, and without requiring any further operations, the element is ready for use.

The material polymethyl methacrylate (PMMA) is preferably used as a synthetic material which has the advantage that it does not exhibit much birefringence.

Figure 2:
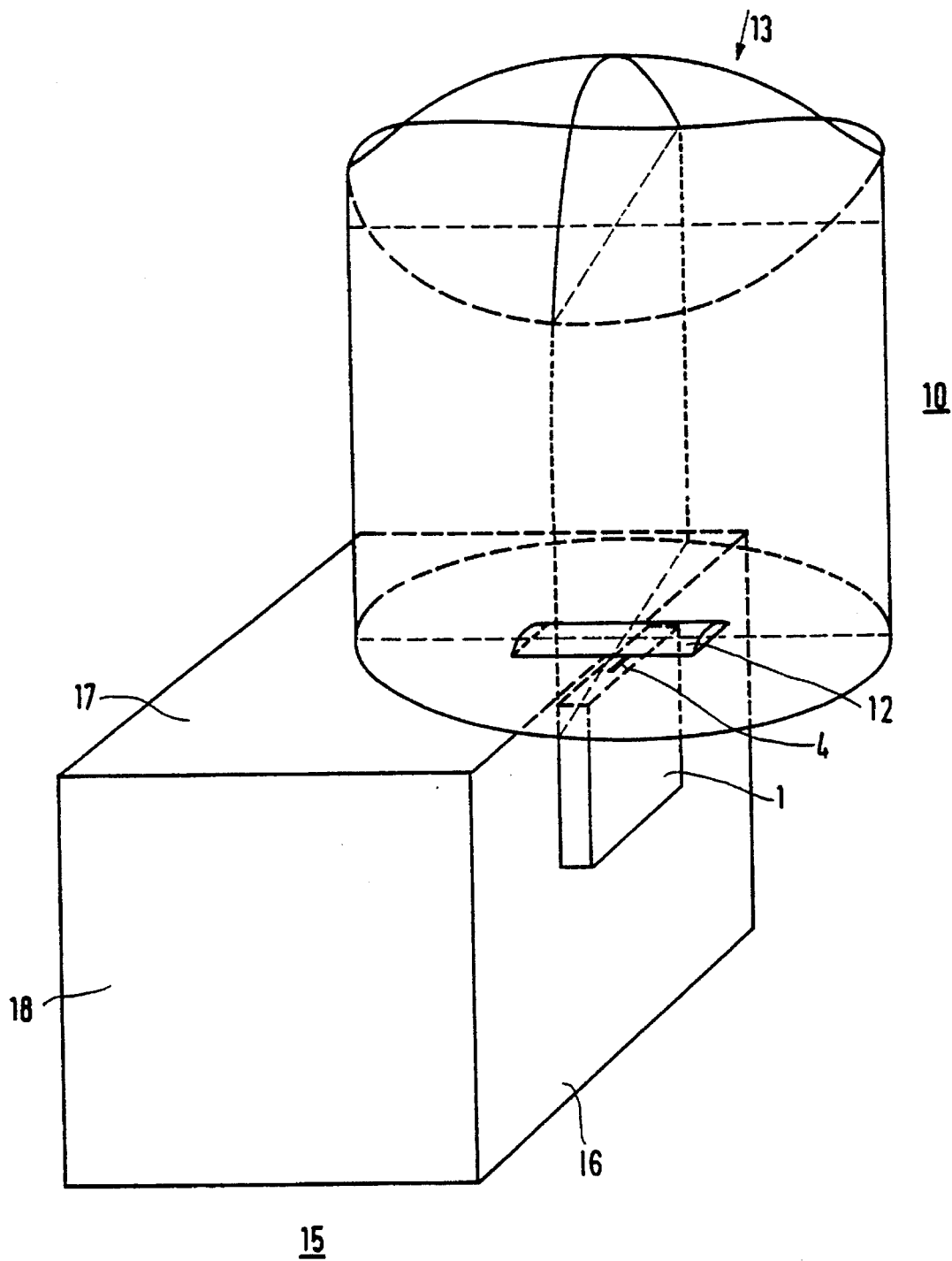
FIG. 2 shows how a diode laser and the beam-shaping element can be fixed with respect to each other.

The beam-shaping element is preferably fixed with respect to the diode laser by mechanically securing this element directly onto the diode laser. An example of such a fixation is shown in FIG. 2. The diode laser 1, whose largest surfaces are, for example 300×300 μm, is secured against a side face 16 of a block 15 of, for example 1×1×1 mm³. The beam-shaping element 10 is arranged on the upper face 17 of the block 15 in such a way that the cylindrical lens 12 of this element is located above the exit facet 4 of the diode laser. The element 10 may be supported by supports (not shown) which are secured to the side face 16 and possibly to the opposite side face 18. The exit facet 4 of the diode laser is now located very close to the cylindrical lens 12, for example at a distance of several tens of microns. Consequently, the desired tolerance of the order of 1 μm for the distance between this facet and the beam-shaping element can be achieved in practice so that no unwanted astigmatism occurs in the beam emerging from the beam-shaping element. Moreover, the exit facet 4 and the beam-shaping element are fixed with respect to each other so that this unwanted astigmatism neither occurs in the case of changing ambient parameters.

Figure 3:
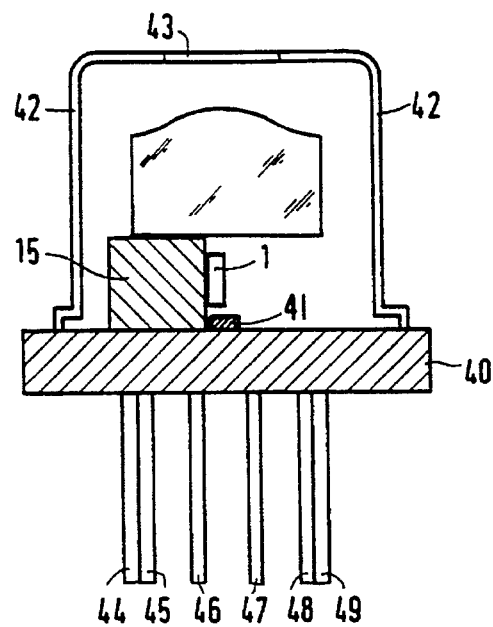
FIG. 3 illustrates how the element can be accommodated in the housing of the diode laser.

In practice a diode laser is accommodated in a housing whose side facing the diode laser front facet has a radiation-transmissive window. In known devices the beam-shaping element is arranged outside the housing and at some distance, for example 1.5 mm from the window, which window is at a distance of, for example 2.5 mm from the diode laser so that the distance between the diode laser and the beam-shaping element is, for example 4 mm. According to the invention, the beam-shaping element may be accommodated in the housing at a very small distance from the laser facet, as is shown in FIG. 3. In this Figure the reference numeral 40 denotes a substrate on which the block 15 is arranged and on which a monitor diode 41 and possible further photodiodes are arranged. The side faces of the housing are denoted by the reference numeral 42 and the radiation-transmissive window in the upper face of the housing is denoted by the reference numeral 43. The elements 44 . . . 47 are some of the connection terminals for the diode laser and the photodiode.

The following parameter values apply for a first specific embodiment of the beam-shaping element which is entirely made of the synthetic material PMMA.

Distance to the diode laser $Z_i$=80 μm.
Curvature of the exit surface:
in the XZ plane $C_{1x}$=−31.25 mm$^{-1}$;
in the YZ plane $C_{1y}$=0.
Thickness D=1.16 min.
Curvature of the exit surface:
in the XZ plane $C_{2,x}$=−0.865 mm$^{-1}$;
in the YZ plane $C_{2,y}$=−0.734 mm$^{-1}$.
The following tolerances apply for this element:

allowed defocusing $\Delta Z_1=2$ μm;
allowed thickness variation $\Delta D=25$ μm;
allowed refractive index variation $\Delta n=0.01$;
allowed decentring:
 in the XZ plane 3 μm;
 in the YZ plane >25 μm;
allowed tilt about the X axis at least 50 mrad;
allowed tilt about the Y axis:
 at least 50 mrad at $NA_{exit}=0.20$;
 at least 15 mrad at $NA_{exit}=0.13$;
 at least 5 mrad at $NA_{exit}=0.10$.

Figure 4:
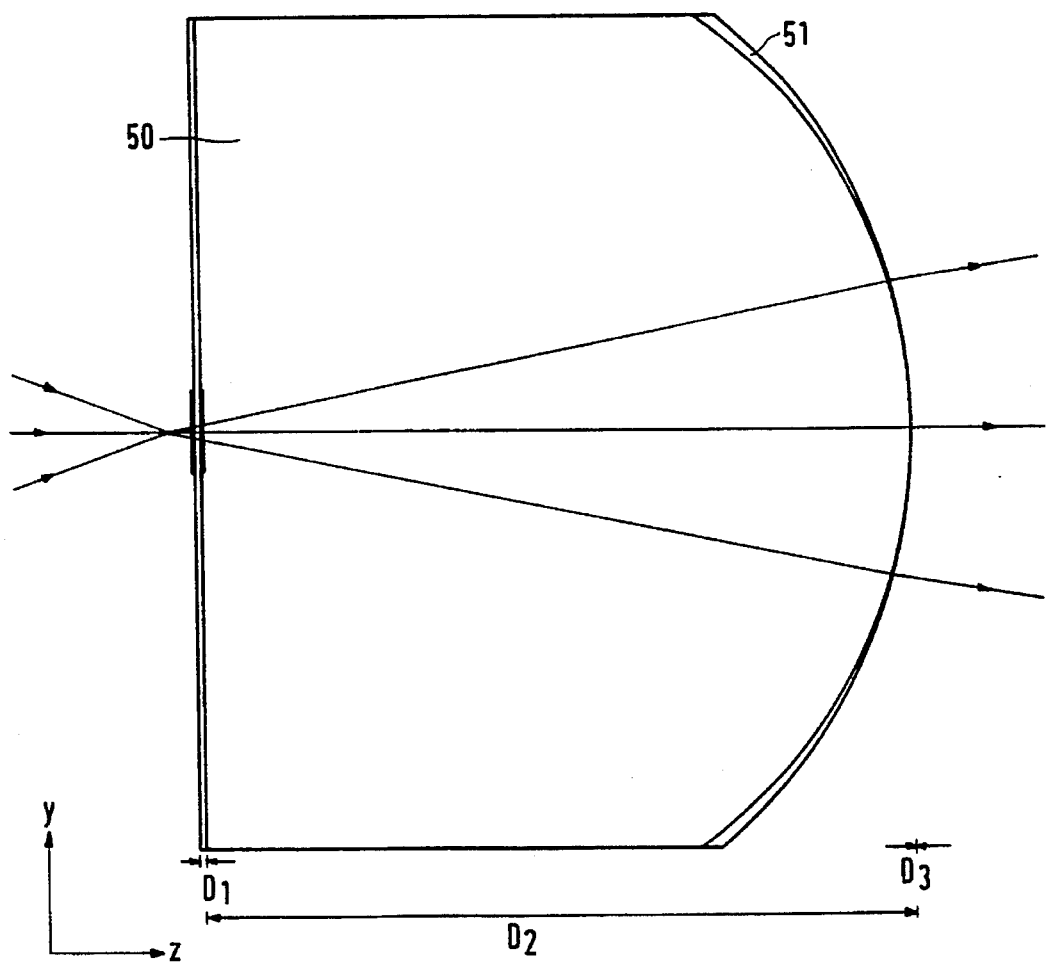
FIG. 4 shows an embodiment of the beam-shaping element.

For a second specific embodiment of the beam-shaping element, a cross-section of which in the YZ plane is shown in FIG. 4 and which is made of a body of glass SFH64 and a layer of the synthetic material Diacryl, the following parameter values apply.

Distance to the diode laser $Z_1=90$ μm
Curvature of the exit surface:
 in the XZ plane $C_{1x}=-37.1$ mm$^{-1}$;
 in the YZ plane $C_{1y}=0$.
 Thickness $D_1=0.017$ mm;
 $D_2=2.50$ mm;
 $D_3=0.002$ mm.

Radius of curvature of the exit surface in the XZ plane: $R_{1x}=-1.859$ mm.

In the YZ plane the exit surface is aspherical with a maximum radius of curvature $R_{2y}=-2.023$ mm and aspherical coefficients $a_2=-0.24715$; $a_4=-0.0132$.

The following tolerances apply for this element:
allowed defocusing $\Delta D_1=1.5$ μm;
allowed thickness variation $\Delta D_2=20$ μm;
allowed refractive index variation:
 for the glass SFH64 $\Delta n_g=0.010$;
 for the Diacryl $\Delta n_d=0.010$;
allowed decentring:
 in the XZ plane 3 μm;
 in the YZ plane >25 μm;
allowed tilt about the X axis: 25 mrad;
allowed tilt about the Y axis: 25 mrad.

The weight of the element is approximately 40 mg. The beam emerging from this element has a circularly symmetrical cross-section and an angular aperture of 0.20. This element receives approximately 94% of the diode laser radiation; the peripheral intensity at NA=0.20 is approximately 6%. If this element is used in a scanning device for optical record carriers, the optical system of this device selects a circular beam with a numerical aperture of 0.15 embracing 80% of the total intensity. Consequently, the peripheral intensity at an NA of 0.15 is 20%.

FIGS. 5a and 5b show the aberration curves for the meridional plane and the sagittal plane for an embodiment of the beam-shaping element made of an SFH16 body and a synthetic material layer with an $NA_{YZ}=0.160$ and an $NA_{XZ}=0.150$. In these Figures the wavefront deviation A (in λ) is plotted on the vertical axis as a function of the position P in the exit pupil (in standardized numerical aperture: $NA_n$). The positioning error in the X direction is 2 μm and in the Y direction 0 μm. The $OPD_{rms}$ is 5 mλ.

Figure 7:
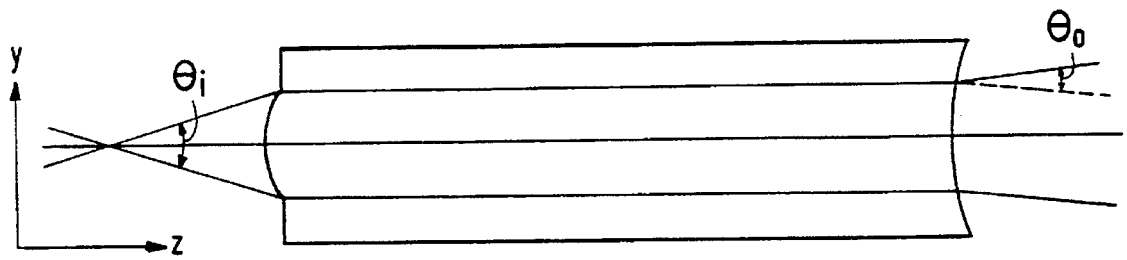
FIG. 7 shows a known beam-shaping element.

For the purpose of comparison FIGS. 6a and 6b show corresponding aberration curves of a known beam-shaping element. A cross-section in the YZ plane of this element is shown in FIG. 7. The angular aperture of the entrance beam $\Theta_1=0.32$ and the aperture $\Theta_2$ of the exit beam is 0.125. For this element the positioning error in the Y direction is 2 μm and in the X direction is 0 μm. The $OPD_{rms}$ is 50 mλ.

Figure 8:
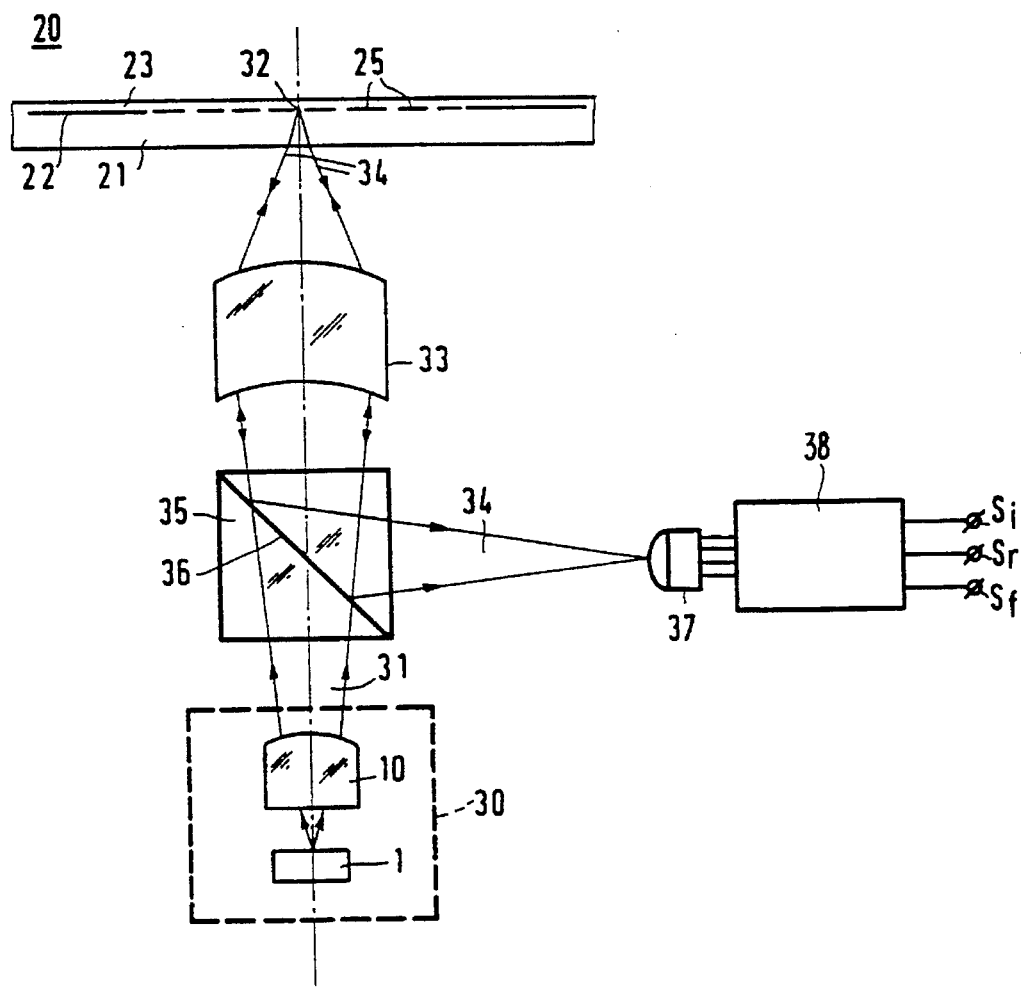
FIG. 8 shows diagrammatically an optical scanning device comprising such a radiation source unit.

FIG. 8 shows diagrammatically a device for optically scanning an information layer of an optical record carrier 20.

Scanning is herein understood to mean scanning for both writing and reading information. The information layer may be a prerecorded layer or a layer which can be provided entirely or partly with information. The record carrier 20, a part of which is shown in a radial cross-section in FIG. 8, comprises a transparent substrate 21, a reflecting information layer 22 and a coating 23. The information layer is divided into a large number of tracks 25 in which information is recorded or can be inscribed in the form of information areas (not shown) which are optically distinguished from their surroundings.

The scanning device comprises a radiation source unit 30 which supplies a beam 31 having a circular cross-section and such an angular aperture that it optimally fills an objective system 33. This system forms a diffraction-limited radiation spot 32 on the information layer. This layer reflects the radiation in a beam 34 which passes through the objective system. To separate the beam 34 spatially from the beam 31, the system is provided with a partially reflecting element, for example a prism 35 having a partially transmissive face 36 which reflects a part of the beam 34 towards a detector 37. An information track can be scanned by rotating the record carrier. All information tracks can be scanned by moving the record carrier with respect to the scanning spot 32 in the radial direction.

During reading, the reflected beam is intensity-modulated in accordance with the information stored in the succession of information areas. The detector 37 converts this modulation into an electric signal. The detector generally comprises a plurality of detector elements so that it supplies a plurality of output signals which are processed in a signal processing circuit 38 to an input signal $S_i$ and a tracking error signal $S_r$ and a focus error signal $S_f$ for a tracking servosystem and a focus servosystem.

For further details of the reading apparatus reference is made to the article "Het systeem "Compact Disc Digital Audio"" by M. G. Carasso, J. B. H. Peek and J. P. Sinjou in Philips Technisch Tijdschrift 40, pp. 267–272, 1981/82, no. 9.

According to the invention, the radiation source unit 30 comprises a diode laser 1 and a beam-shaping element 10 according to the invention as described hereinbefore. This radiation source unit supplies a beam which has a stable wavefront and with an intensity which represents a large part of the intensity produced by the diode laser. The radiation source unit is thus very suitable for a writing device with which information can be written, for example, ablatively, by surface deformation or by a magneto-optical process. During writing the beam 31 is modulated, for example by means of an acousto-optical modulator or by modulating the electric current through the diode laser.

FIG. 8 only illustrates the principle of an optical scanning device with reference to one embodiment. There are numerous embodiments of this scanning device, and the radiation source unit according to the invention may be used in each of these embodiments. The invention may not only be used in optical devices for scanning optical record carriers, but generally in optical devices which include one or more diode lasers as a radiation source and in which a radiation beam of a high intensity and a wavefront having only small deviations are necessary. An optical printer is an example of such device.

It is not always necessary to convert a radiation beam having an elliptical cross-section into a beam having a completely circular cross-section, but it may also be sufficient or desirable to convert a beam whose cross-section has a highly elliptical shape into a beam whose cross-section has a less highly elliptical shape. The invention may also be used in optical systems in which the latter is realised. Moreover, it is not necessary to use the two aspects of the invention in combination because they already present essential advantages of themselves. The idea of arranging the entrance surface of the beam-shaping element at a short distance from the radiation-emitting surface of the radiation source may also be used in a system with a conventional beam-shaping element. If the beam-shaping element according to the invention, in which the angular aperture is magnified in one plane and reduced in a second plane, is arranged at a larger distance from the radiation source, it is also possible to benefit from the less stringent tolerance requirements imposed on this element.

I claim:

1. A beam-shaping optical element comprising: an element material having an entrance surface, an exit surface located opposite thereto and an optical axis which coincides with the Z axis of a three-axis rectangular XYZ system of coordinates for converting a beam having a first longitudinal ratio between a first angular aperture in the YZ plane of the system of coordinates and a second, smaller angular aperture in the XZ plane into a beam having a second longitudinal ratio between said angular apertures, the second longitudinal ratio being smaller than the first longitudinal ratio, said element realising angular magnifications in said two planes wherein the angular magnifications differ from one another, wherein the entrance surface is centrally provided with a substantially cylindrical portion whose cylindrical axis is parallel to the Y axis and introduces an angular reduction of the order of $n_1/n_2$ in the YZ plane and an angular magnification of the order of $n_2/n_1$ in the XZ plane, in which $n_2$ and $n_1$ are the refractive indices of the element material and a medium surrounding the element, respectively, and wherein the exit surface is a toroidal surface whose radius of curvature in the XZ plane is larger than that in the YZ plane.

2. A beam-shaping element as claimed in claim 1, wherein a spherical surface is superimposed on the toroidal exit surface.

3. A beam-shaping element as claimed in claim 1, wherein the element comprises a glass body whose front side and/or rear side is provided with a layer of transparent synthetic material in which the cylindrical shape and/or the toroidal shape, respectively, is provided.

4. A beam-shaping element as claimed in claim 3, wherein the synthetic material is polymethyl methacrylate.

5. A radiation source unit comprising:

a diode laser having a radiation-emitting surface, said diode laser for supplying a beam having a first elliptical cross-section;

a beam-shaping element for converting the beam supplied by said diode laser into a converted beam having a cross-section which is less elliptical than that of the diode laser beam; and means for positioning said diode laser and said beam-shaping element with respect to one another such that the distance between the radiation-emitting surface of said diode laser and the entrance plane of said beam-shaping element is at most several hundred µm, wherein said beam-shaping element comprises an element material having an entrance surface, an exit surface located opposite thereto and an optical axis which coincides with the Z axis of a three-axis rectangular XYZ system of coordinates for converting a beam having a first longitudinal ratio between a first angular aperture in the YZ plane of the system of coordinates and a second, smaller angular aperture in the XZ plane into a beam having a second longitudinal ratio between said angular apertures, the second longitudinal ratio being smaller than the first longitudinal ratio, said element realising angular magnifications in said two planes wherein the angular magnifications differ from one another, wherein the entrance surface is centrally provided with a substantially cylindrical portion whose cylindrical axis is parallel to the Y axis and introduces an angular reduction of the order of $n_1/n_2$ in the YZ plane and an angular magnification of the order of $n_2/n_1$ in the XZ plane, in which $n_2$ and $n_1$ are the refractive indices of the element material and a medium surrounding the element, respectively, and wherein the exit surface is a toroidal surface whose radius of curvature in the XZ plane is larger than that in the YZ plane.

6. A radiation source unit as claimed in claim 5, wherein said beam-shaping element further comprises a glass body whose front side and/or rear side is provided with a layer of transparent synthetic material in which the cylindrical shape and/or the toroidal shape, respectively, is provided.

7. A radiation source unit as claimed in claim 6, wherein the synthetic material is polymethyl methacrylate.

8. A radiation source unit as claimed in claim 5, wherein said beam-shaping element is accommodated in a housing of said diode laser.

9. An optical scanning device for scanning an information plane, said device comprising:

a radiation source unit for supplying a radiation beam;

an objective system for focusing the radiation beam supplied by said radiation source unit to form a scanning spot on the information plane; and a radiation-sensitive detection system for converting radiation reflected from the information plane into electrical signals, characterized by a radiation source unit as claimed in claim 5.

10. A radiation source unit as claimed in claim 5, further wherein a spherical surface is superimposed on the toroidal exit surface.

11. A radiation source unit as claimed in claim 5, wherein said beam-shaping element and said diode laser are secured on a common support.

12. A radiation source unit comprising:

a diode laser having a radiation-emitting surface, said diode laser for supplying a beam having a first elliptical cross-section;

a beam-shaping element for converting the beam supplied by said diode laser into a converted beam having a cross-section which is less elliptical than that of the diode laser beam, wherein said beam-shaping element comprises an element material having an entrance surface, an exit surface located opposite thereto and an optical axis which coincides with the Z axis of a three-axis rectangular XYZ system of coordinates for converting a beam having a first longitudinal ratio between a first angular aperture in the YZ plane of the system of coordinates and a second, smaller angular aperture in the XZ plane into a beam having a second longitudinal ratio between said angular apertures, the second longitudinal ratio being smaller than the first longitudinal ratio, said element realising angular magnifications in said two planes wherein the angular magnifications differ from one another, wherein the entrance surface is centrally provided with a substantially cylindrical portion whose cylindrical axis is parallel to the Y axis and introduces an angular reduction of the order of $n_1/n_2$ in the YZ plane and an angular magnification of the order of $n_2/n_1$ in the XZ plane, in which $n_2$ and $n_1$ are the refractive indices of the element material and a medium surrounding the element, respectively, and wherein the exit surface is a toroidal surface whose radius of curvature in the XZ plane is larger than that in the YZ plane; and means for positioning said diode laser and said beam-shaping element with respect to one another at a prescribed distance between the radiation-emitting surface of said diode laser and the entrance plane of said beam-shaping element.

13. An optical scanning device for scanning an information plane, said device comprising:

a radiation source unit for supplying a radiation beam;

an objective system for focusing the radiation beam supplied by said radiation source unit to form a scanning spot on the information plane; and a radiation-sensitive detection system for converting radiation reflected from the information plane into electrical signals, characterized by a radiation source unit as claimed in claim 12.

14. A radiation source unit as claimed in claim 12, further wherein a spherical surface is superimposed on the toroidal exit surface of said beam-shaping element.

15. A radiation source unit as claimed in claim 12, wherein said beam-shaping element further comprises a glass body whose front side and/or rear side is provided with a layer of transparent synthetic material in which the cylindrical shape and/or the toroidal shape, respectively, is provided.

16. A radiation source unit as claimed in claim 15, wherein the synthetic material is polymethyl methacrylate.

17. A radiation source unit as claimed in claim 12, wherein said beam-shaping element and said diode laser are secured on a common support.

18. A radiation source unit as claimed in claim 12, wherein said beam-shaping element is accommodated in a housing of said diode laser.

* * * * *